(12) United States Patent
Kerkman et al.

(10) Patent No.: US 9,124,245 B2
(45) Date of Patent: Sep. 1, 2015

(54) ADAPTIVE ONLINE FILTER FOR DC OFFSET ELIMINATION

(71) Applicant: Rockwell Automation Technologies, Inc., Mayfield Heights, OH (US)

(72) Inventors: Russel J. Kerkman, Milwaukee, WI (US); Ahmed Mohamed Sayed Ahmed, Mequon, WI (US); Brian J. Seibel, Grafton, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 14/551,333

(22) Filed: Nov. 24, 2014

(65) Prior Publication Data

US 2015/0077167 A1      Mar. 19, 2015

Related U.S. Application Data

(62) Division of application No. 13/537,993, filed on Jun. 29, 2012, now Pat. No. 8,964,427.

(51) Int. Cl.
| | |
|---|---|
| *H03H 11/04* | (2006.01) |
| *H03F 1/56* | (2006.01) |
| *H03H 7/38* | (2006.01) |
| *G01R 25/00* | (2006.01) |
| *H02M 1/42* | (2007.01) |

(52) U.S. Cl.
CPC .............. *H03H 11/04* (2013.01); *G01R 25/00* (2013.01); *H03F 1/565* (2013.01); *H03H 7/38* (2013.01); *H02M 1/4233* (2013.01); *Y02B 70/126* (2013.01)

(58) Field of Classification Search
CPC ................................ H03H 11/04; G01R 25/00
See application file for complete search history.

(56) References Cited

U.S. PATENT DOCUMENTS

| | | | |
|---|---|---|---|
| 4,249,120 A | 2/1981 | Earle | |
| 7,180,940 B2 | 2/2007 | Li et al. | |
| 8,352,203 B2 | 1/2013 | Seibel et al. | |
| 8,436,693 B2 | 5/2013 | Fahs et al. | |
| 8,575,915 B2 | 11/2013 | Kerkman et al. | |
| 2004/0048585 A1* | 3/2004 | Snyder et al. | 455/115.1 |
| 2007/0152750 A1* | 7/2007 | Andersen et al. | 330/136 |
| 2011/0128054 A1 | 6/2011 | Kerkman et al. | |

OTHER PUBLICATIONS

Karimi-Ghartemani, et al., "Addressing DC Component in PLL and Notch Filter Algorithms", IEEE Transactions on Power Electronics, vol. 27, No. 1, Jan. 2012, pp. 78-86.
Chung, "A Phase Tracking System for Three Phase Utility Interface Inverters", IEEE Transactions on Power Electronics, vol. 15, No. 3, May 2000, pp. 431-438.
Ciobotaru, et al., "Offset rejection for PLL based synchronization in grid-connected converters", 2008 IEEE, pp. 1611-1617.

* cited by examiner

*Primary Examiner* — Emily P Pham
(74) *Attorney, Agent, or Firm* — Fay Sharpe LLP

(57) ABSTRACT

A phase angle detector with a PLL, a power converter, and a method for reducing offsets in an input signal, in which an adaptive offset processor selectively removes a DC offset component from the input signal to generate a modified signal including a fundamental frequency component and higher order harmonics of the input signal with the DC offset component removed, and the PLL provides a phase angle signal at least partially according to the modified signal.

20 Claims, 3 Drawing Sheets

ADAPTIVE ONLINE FILTER FOR DC OFFSET ELIMINATION

REFERENCE TO RELATED APPLICATION

This application is a divisional of, and claims priority to and the benefit of, U.S. patent application Ser. No. 13/537,993, filed on Jun. 29, 2012, entitled ADAPTIVE ONLINE FILTER FOR DC OFFSET ELIMINATION, the entirety of which application is hereby incorporated by reference.

BACKGROUND

Motor drives and other power conversion systems typically receive AC input power from a grid or other power source and convert that to DC for driving a load such as a DC motor, or an inverter may convert the DC to AC output power for driving an AC motor or other load. Many such power converters include active front end (AFE) rectifier stages with switching devices to rectify the input AC power. In many power conversion control schemes, synchronization of the front end converter operation with the phase angle of the input AC power is desirable, for instance, in performing power factor control, attempting to minimize total harmonic distortion, etc. Synchronizing power converters to the grid power is typically done using phase locked loops (PLLs) to provide a phase signal to the converter controller based on sensed phase voltages. However, many phase voltage sensors suffer from low frequency or DC offsets or drift, as well as higher order harmonics, and imbalance in the voltage which can corrupt the phase signal output from the phase lock loop.

Some solutions to this problem employ one or more tracking filters in the feedback loop of a PLL to eliminate error signal disturbances. Examples are illustrated and described in U.S. patent application Ser. No. 12/627,472 to Kerkman et al., filed Nov. 30, 2009, published on Jun. 2, 2011 as Publication No. US 2011/0128054 A1 entitled "PHASE LOCK LOOP WITH TRACKING FILTER FOR SYNCHRONIZING AN ELECTRIC GRID", and assigned to the assignee of the present disclosure, which is hereby incorporated by reference in its entirety. However, difficulties may arise in implementing harmonic tracking filters in conjunction with a tracking filter at the fundamental frequency due to filter bandwidth overlap or proximity, and this approach may thus yield bandwidth limitations for the PLL.

U.S. patent application Ser. No. 12/706,488 to Kerkman et al., filed Feb. 16, 2010, published on Aug. 18, 2011 as Publication No. US 2011/0199072 A1 entitled "POWER CONTROL SYSTEM AND METHOD", and assigned to the assignee of the present disclosure provides electrical device control systems and methods using tracking filter devices, and U.S. patent application Ser. No. 12/627,400 to Seibel et al., filed Nov. 30, 2009, published on Jun. 2, 2011 as Publication No. US 2011/0130993 A1 entitled "DIGITAL IMPLEMENTATION OF A TRACKING FILTER", and assigned to the assignee of the present disclosure presents a digital implementation of such a tracking filter. The entireties of these published applications are hereby incorporated by reference. Other solutions to the above shortcomings may include low pass filter nulling of the DC offset, but this requires additional hardware thereby increasing the cost, size and weight of power converter systems.

Accordingly, there is a continuing need for improved techniques and apparatus for controlling offsets in grid synchronization PLLs and in other applications in which offsets need to be removed from an input signal.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides adaptive online filtering techniques by which offsets can be removed from one or more input signals prior to use in a PLL feedback path, thereby facilitating offset signal control with the possibility of using one or more tracking filters to control higher order harmonics while avoiding or mitigating the potential of filter overlap in a PLL augmented with one or more tracking filters. The techniques and apparatus of the present disclosure find utility in power converter synchronization situations as well as in other applications in which it is desired to remove DC offsets from one or more input signals.

Adaptive offset processing apparatus is disclosed which includes an adaptive tracking filter with a passband corresponding to a frequency signal, such as a frequency signal of a phase lock loop, along with a low pass filter. The adaptive tracking filter removes frequency components of an input signal that are outside the passband to provide a fundamental frequency signal that is subtracted from the input signal to generate a first modified signal with the fundamental frequency component substantially removed. This signal as provided to the low pass filter which generates a second modified signal including a DC offset component with a fundamental and higher order harmonics substantially removed. The second modified signal is subtracted from the input signal to generate a third modified signal substantially including the fundamental and higher order harmonics with the DC offset component substantially removed. In certain embodiments, the low pass filter cutoff frequency is below the fundamental frequency component, and the apparatus may be implemented to accommodate analog and/or digital input as well as analog and/or digital frequency signals.

In accordance with further aspects of the disclosure, a phase angle detector apparatus is provided, which includes an adaptive offset processing apparatus operative to selectively remove a DC offset component from an input signal. The adaptive offset processing apparatus provides a modified output signal substantially including the fundamental frequency component and higher order harmonics of the input signal, with the DC offset component substantially removed. The phase angle detector apparatus further includes a phase lock loop to provide a phase angle output signal at least partially according to the modified output signal from the adaptive offset processor. In certain embodiments, the phase angle detector includes one or more tracking filters coupled with the phase lock loop to estimate and reduce a disturbance frequency component in the modified signal.

A power conversion system is provided in accordance with other aspects of the disclosure for converting power from an AC power source to drive a load. The power conversion system includes an active front end (AFE) converter, such as a switching rectifier in certain embodiments, which converts input power to output DC power, and a converter controller provides one or more switching control signals to the active front end converter. The power conversion system also includes a phase angle detector that receives one or more sensor input signals representing AC power source phase voltages, and provides a phase angle signal to the converter controller for synchronizing with the AC power source. The phase angle detector includes an adaptive offset processor which selectively removes a DC offset component from the sensor input signal(s) to generate at least one modified signal substantially including the fundamental frequency component and higher order harmonics of the sensor input signal with the DC offset component substantially removed. In addition, the phase angle detector includes a phase lock loop which provides the phase angle signal to the converter based at least partially on the modified signal from the adaptive offset processor. In certain embodiments, one or more tracking filters are operatively coupled in the phase lock loop to estimate and reduce a disturbance frequency component in the modified signal.

In accordance with further aspects of the present disclosure, a method and a non-transitory computer readable medium with computer executable instructions are provided for reducing at least one offset component in an input signal. The method includes removing substantially all frequency components of the input signal that are outside an adaptive passband defined by a frequent signal to generate a fundamental frequency signal, as well as subtracting the fundamental frequency signal from the input signal to generate a first modified signal with a fundamental frequency component substantially removed. The method further includes removing substantially all high frequency components above a cut-off frequency from the first modified signal to generate a second modified signal including a DC offset component with the fundamental frequency component and higher order harmonics substantially removed. The method also include subtracting the second modified signal from the input signal to generate a third modified signal substantially including the fundamental frequency component and higher order harmonics of the input signal with the DC offset component substantially removed.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
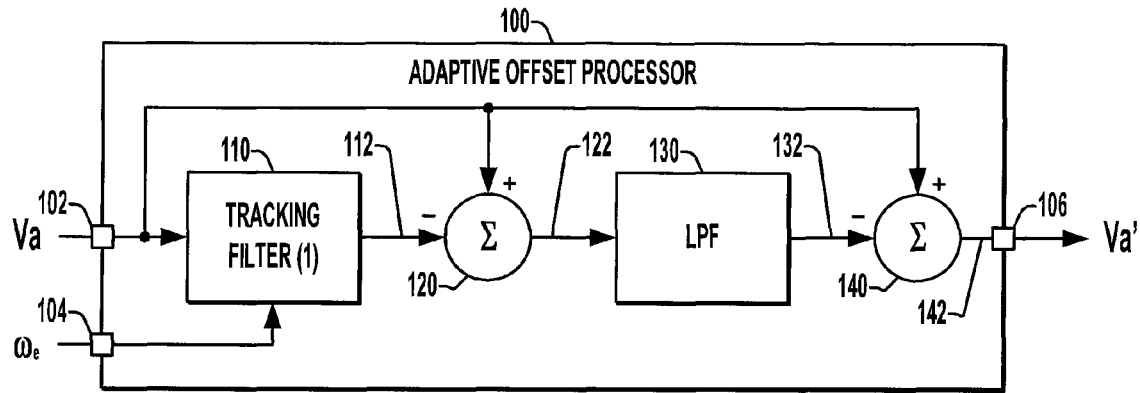
FIG. 1 is a schematic diagram illustrating an exemplary adaptive offset processor for selective removal of an offset from an input signal in accordance with one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale.

An adaptive offset processing apparatus 100 is illustrated in FIG. 1, which may be used in any application in which it is desirable to remove an offset from an input signal. For example, the apparatus 100 may be used in a phase angle detector 10 as illustrated and described below in connection with FIG. 2, and such may be employed in power conversion systems as exemplified in FIG. 4, although the present disclosure is not limited to power conversion or grid phase synchronization applications. The adaptive offset processor 100 and the components 110, 120, 130 and/or 140 thereof may be implemented in hardware (including analog or digital circuitry or combinations thereof), processor-executed software or firmware, programmable logic, and/or combinations thereof. In motor drive or other power converter applications, for instance, the adaptive offset processing concepts of the present disclosure may be implemented as firmware upgrades to a processor-based power converter controller (e.g., FIG. 4), without the added cost and weight of additional hardware filtering in order to mitigate or eliminate offsets or drift problems often associated with phase voltage sensors used in synchronizing power conversion equipment with a power grid.

Figure 2:
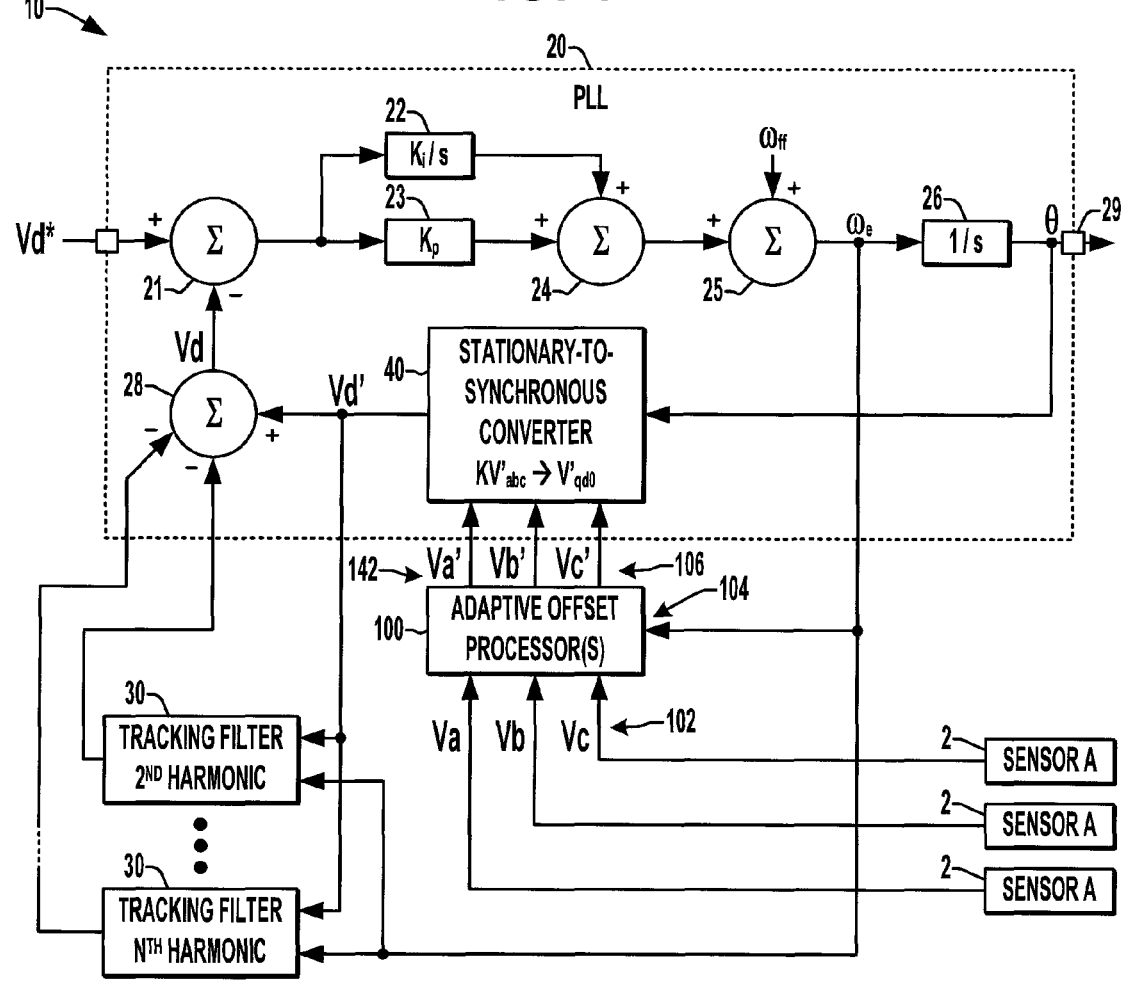
FIG. 2 is a schematic diagram illustrating an exemplary phase angle detector including an adaptive offset processor operating on input sensor signals in providing modified signals with offsets removed to a phase lock loop in accordance with further aspects of the disclosure.
Figure 3:
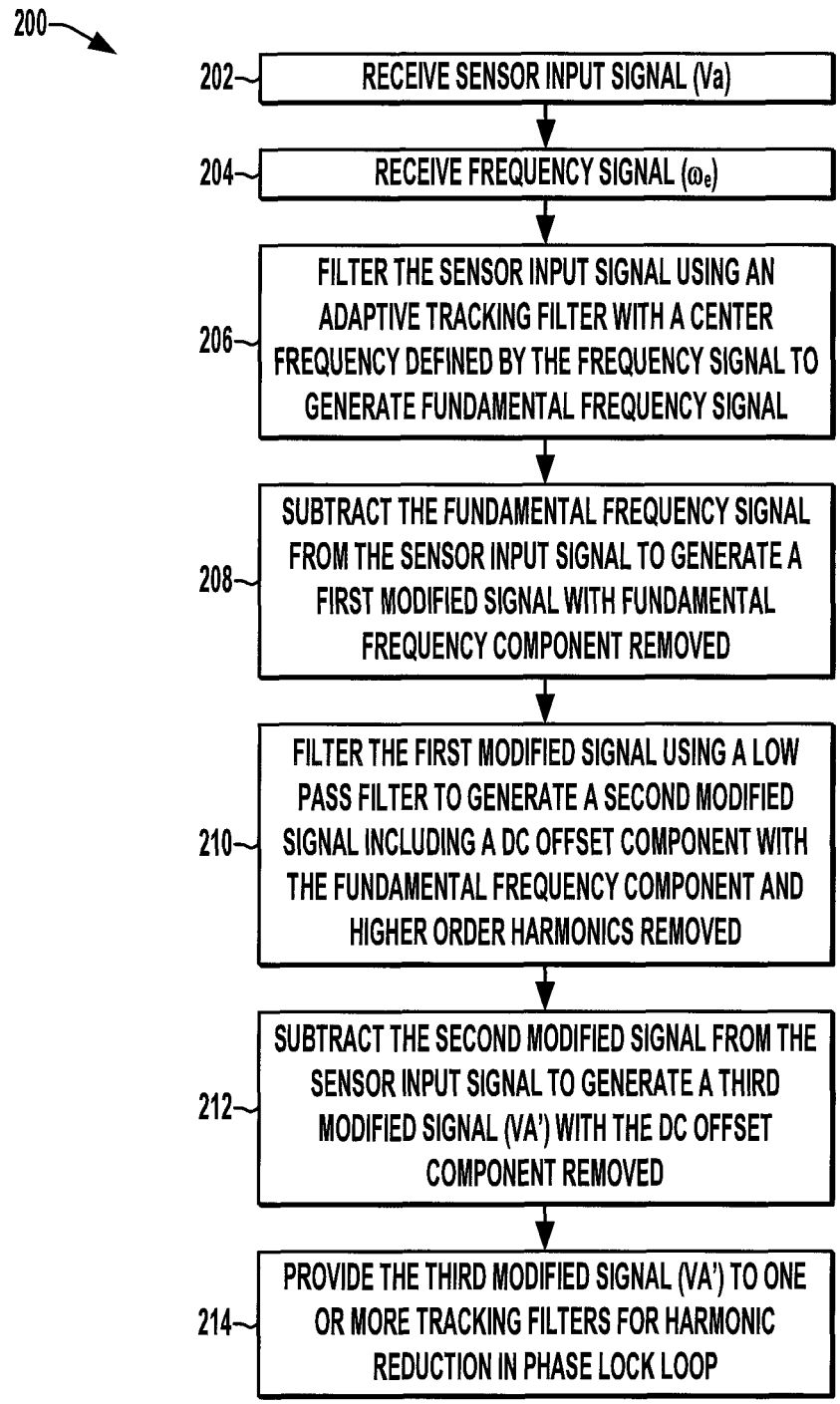
FIG. 3 is a flow diagram illustrating an exemplary method for reducing or removing offset or drift from one or more input signals in accordance with further aspects of the disclosure.
Figure 4:
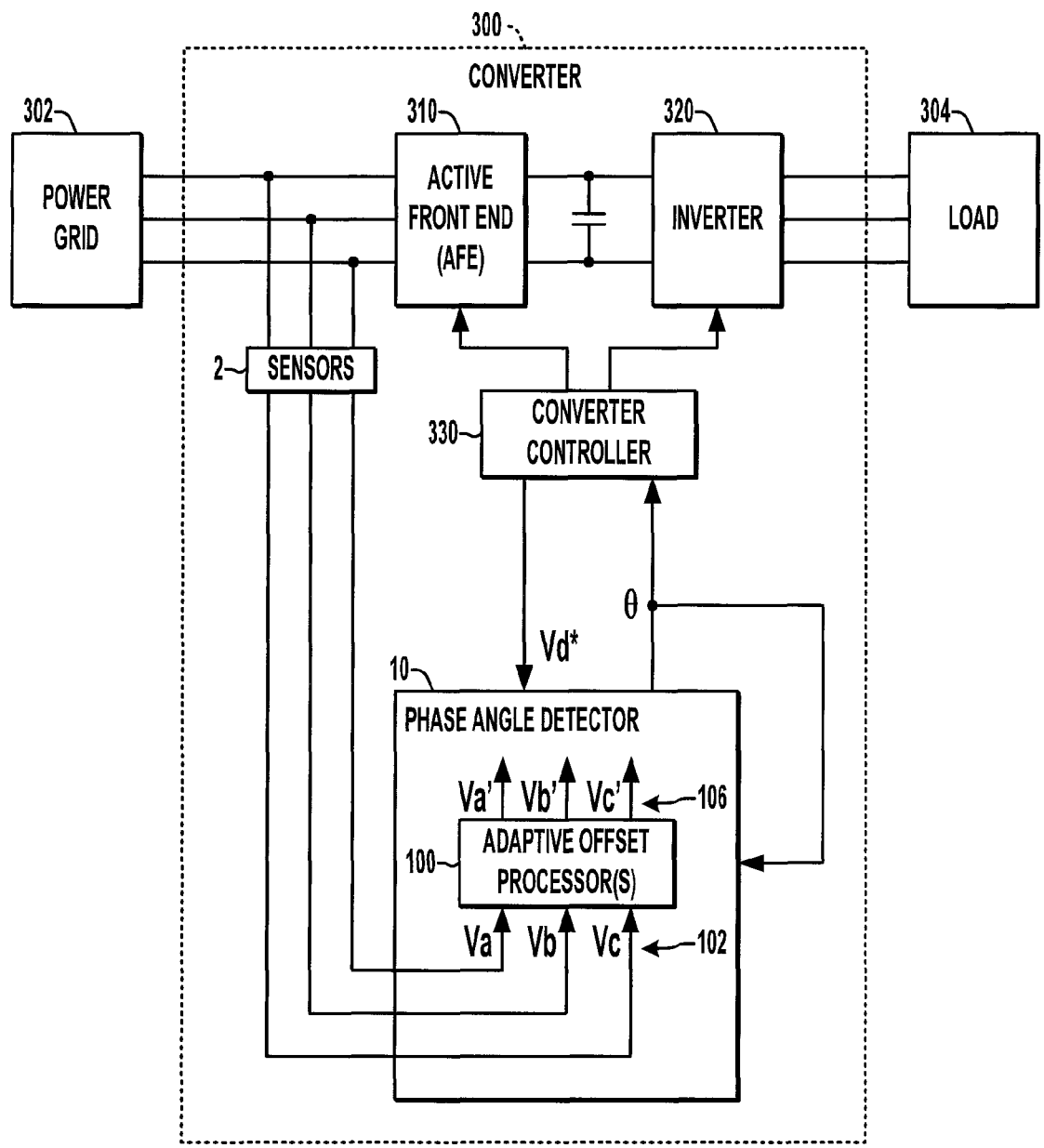
FIG. 4 is a schematic diagram illustrating an exemplary power conversion apparatus with a phase angle detector and adaptive offset processor in accordance with other aspects of the disclosure.

The adaptive offset processing apparatus 100 operates on one or more input signals received at an input 102. In the example of FIG. 1, a single phase voltage sensor input signal Va is shown, and in other typical applications the adaptive offset processing apparatus 100 may be replicated for any number of such phase voltage sensor input signals (e.g., Va, Vb and Vc in a typical three-phase case, such as shown in FIGS. 2 and 4 below). As seen in the example of FIG. 3, moreover, the input signal may be received from a sensor 2, such as a phase voltage sensor conventionally found in power conversion system such as motor drives. In other possible implementations, the input signal(s) may be obtained from any form of sensor(s) 2, including without limitation current sensors. In this regard, sensor drift presents difficulties with respect to phase synchronization, and is manifest as DC offsets in the signals provided by the sensors 2, particularly for conventional voltage sensors. This drift or offset in the sensor signal, in turn, has adverse effects on the ability to create a phase output signal (e.g., Θ provided as a PLL output 29 as seen in FIG. 2 below) using the closed loop processing of a phase lock loop.

In order to facilitate reduction or elimination of such DC offsets or drifts in one or more sensor input signals, the offset processing apparatus 100 in FIG. 1 includes an adaptive tracking filter 110 receiving the input signal Va via a sensor signal input 102 and the tracking filter 110 also receives a frequency signal $\omega_e$ via a second input 104. The apparatus 100 also includes a first summer 120, a low pass filter 130, and a second summer 140 providing a modified (e.g., offset removed) output signal 142 to an output 106. Moreover, unlike prior offset reduction approaches using fundamental frequency tracking filters within the feedback path of a phase lock loop, the adaptive tracking filter 110 of the present disclosure operates directly on the sensor input signal Va and provides at least one modified output signal 142 which can then be introduced into a PLL as shown in FIG. 2 below. In this manner, the offset reduction/elimination achieved by the offset processor 100 is not impacted by overlap or proximity of harmonic tracking filters 30 (e.g., FIG. 2 below) operating on the feedback path of the PLL, and the operation of the offset processor 100 does not adversely impact the operation of such harmonic tracking filters 30.

The adaptive tracking filter 110 in certain embodiments is a bandpass filter including an adaptive passband which is defined by the frequency signal $\omega_e$. In operation, the tracking filter 110 performs bandpass filtering to remove substantially all frequency components of the input signal Va that lie outside the adaptive passband while passing the frequencies within the passband. Accordingly, the adaptive filter 110 generates a fundamental frequency signal 112 that is provided as a subtractive input to the first summer 120. In this regard, as is known with analog and/or digital filtering technology, an ideal bandpass filter would remove all frequency components outside a defined passband, but in practice, analog and digital filters are not perfect. Accordingly, it will be appreciated that the adaptive tracking filter 110 may pass reduced levels of certain frequency components outside its defined passband, but these are at least substantially reduced compared with the corresponding output-of-band components of the original input signal Va.

In addition, the bandpass filter implemented by certain embodiments of the adaptive tracking filter 110 is "adaptive" as the passband is defined by the frequency signal $\omega_e$ received via the second input 104. In practice, this frequency signal $\omega_e$ can be a frequency estimate provided by a phase lock loop (e.g., see FIG. 2), or can be received from any other suitable frequency selection component of a given signal processing system. The adaptive tracking filter 110, whether implemented as analog circuitry or as a digital filter, adapts the passband according to the received frequency signal $\omega_e$, and thus the filter 110 itself, and the offset processor 100 as a whole, adapt to the received frequency signal $\omega_e$. In certain embodiments, the adaptive tracking filter 110 may be implemented as a digital tracking filter according to the concepts disclosed in US patent application publication number US 2011/0130993 A1, assigned to the Assignee of the present disclosure, which is incorporated herein by reference in its entirety.

The initial summer 120 subtracts the fundamental frequency signal 112 from the input signal Va and thereby generates a first modified signal 122 with the fundamental frequency component substantially removed. In practice, the summer 120 (as well as the final summer 140 in FIG. 1) can be implemented as analog summing circuitry with various operational amplifiers, resistors, and other suitable components, or the summation function of the summing components 120, 140 may be implemented in processor-executed software, firmware, programmable logic, etc., for digital filtering and signal processing of sampled digital values representing the various signals 112, 122, 132 and 142 described herein. In this regard, the sensor input signal(s) (e.g., Va in FIG. 1) and/or the frequency signal $\omega_e$ can be analog signals or one or both of these may be a digital signal including a plurality of values or samples.

The low pass filter (LPF) 130 receives the first modified signal 122 from the summer 120 and implements low pass filtering according to an associated cutoff frequency. In certain embodiments, the cutoff frequency of the low pass filter 130 is below the fundamental frequency component of the input signal Va (e.g., below the frequency represented by the frequency signal co, such as about 1 Hz to 10 Hz in certain embodiments). In certain implementations, moreover, the low pass filter 130 may be adaptive as well, with the associated cutoff frequency being adjustable according to the frequency signal $\omega_e$ received from the input 104. The low pass filtering removes substantially all the high frequency components from the first modified signal 122 and the filter 130 generates a second modified signal 132 which includes the DC offset component of the original input signal Va, without the fundamental frequency component and without the higher order harmonics. In this regard, as discussed above in connection with the tracking filter 110, an ideal low pass filter 130 would remove all such fundamental and higher order harmonic components, but in practice the low pass filter 130 may be implemented so as to substantially remove such frequency components, with certain frequencies above the established cutoff frequency possibly being included, but substantially reduced.

The second modified signal 132 from the low pass filter 130 is provided as a subtractive input to the second summer 140 which subtracts this signal 132 from the sensor input signal Va, and the resulting third modified signal 142 is provided to the output 106 substantially including the fundamental frequency component and higher order harmonics of the input signal Va with the DC offset component thereof substantially removed. As a result of the operation of the adaptive offset processor 100, therefore, the modified signal Va' provided at the output 106 is substantially the same as the sensor input signal Va, except that the DC or very low frequency offsets are removed. Consequently, any sensor drift or other source of DC offset in the signal path providing the input Va is effectively removed by the offset processing apparatus 100.

FIG. 2 illustrates an exemplary phase angle detector apparatus 10 including a three phase adaptive offset processor or processors 100, for which the processing of each associated phase voltage sensor input signal Va, Vb, Vc generally operates as described above in connection with FIG. 1. In certain implementations, three separate adaptive office set processors 100 can be provided, each operating on an associated phase voltage sensor input signal 102 Va, Vb, Vc from the phase voltage sensors 2, and each generating a corresponding modified signal 142 Va', Vb', Vc' with any DC offset or drift removed therefrom. In other possible embodiments, single adaptive offset processor 100 can be used which accommodates multiple input signals 102 and provides multiple corresponding modified output signals 142 at the output 106. The offset processor(s) 100, moreover, is/are adaptive as described above, receiving a frequency input signal $\omega_e$ via an input 104, where the processor(s) 100 may operate according to a single frequency input signal $\omega_e$ or a separate frequency signal $\omega_e$ can be provided for each phase. In certain embodiments where the offset processor(s) 100 is implemented in a power conversion system controller (e.g., converter controller 330 shown in FIG. 4 below), digital signal processing can be used for implementing the adaptive offset processing system or systems 100 via processor-executed software or firmware with the necessary signal conditioning circuitry (e.g., analog-to-digital converters for providing digital values representing signals from the sensors 2).

As seen in FIG. 2, the offset-reduced modified signals 142 Va', Vb', Vc' are provided as inputs to a stationary-to-synchronous converter 27 of a phase lock loop 20 which implements a stationary reference frame-to-synchronous reference frame conversion for generation of the PLL phase output signal Θ. This is indicated in FIG. 2 as a transformation of a three dimensional stationary reference frame vector KV'$_{abc}$ based on the signal inputs 142 (Va', Vb', Vc') from the adaptive offset processor 100 to provide a synchronous reference frame set of values including a q-axis voltage Vq', a d-axis voltage Vd', and a zero sequence value represented as a vector V'$_{qd0}$. The phase lock loop 20 receives a synchronous reference frame d-axis voltage command Vd* (e.g., from a converter controller 330 as shown in FIG. 4 below), and a first summer 21 subtracts a d-axis signal Vd from the d-axis voltage command Vd* to generate an error signal. In practice, synchronous reference frame power converter control of an active front end rectifier (e.g., in a motor drive grid voltage synchronization implementation) will generally have the d-axis voltage command Vd* set to zero, with the q-axis voltage being controlled according to output motor load speed and/or torque requirements, although a zero value d-axis voltage command Vd* is not a requirement of all embodiments of the present disclosure.

The error signal from the summer 21 as provided to a compensator implemented as an integrator 22 ($K_i/s$) and an amplifier 23 ($K_p$) with the outputs of the integrator 22 and the amplifier 23 being added by a summer 24. The output of the summer 24 may be supplemented or offset by a frequency signal $\omega_{ff}$ using a summer 25, the output of which is the PLL frequency estimate signal $\omega_e$ that is provided as an input to the adaptive offset processor 100. In addition, the frequency estimate signal $\omega_e$ is integrated by an integrator 26 (1/s) to generate the output phase signal Θ provided to the PLL output 29 and also used as an input by the stationary-to-synchronous converter 27. The 3-2 reference frame converter 27 provides the d-axis voltage reference signal Vd' (with DC or low frequency offsets or drift removed by operation of the adaptive offset processor(s) 100) either directly as a subtractive input to the summer 21 to complete the PLL feedback loop, or one or more harmonic tracking filters 30 can be provided along with an additional summer 28 in certain embodiments. Although the embodiment of FIG. 2 is illustrated as using a stationary-synchronous reference frame conversion 27 to operate on d-axis voltage signals, alternate embodiments are possible using sine and cosine processing as illustrated and described for example in US patent application publication number US 2011/0130993 A1, incorporated herein by reference.

As seen in FIG. 2, in-loop harmonic tracking filter embodiments can be implemented using one or more tracking filters 30, each receiving the frequency estimate signal $\omega_e$ and the modified d-axis voltage signal Vd' as inputs. As disclosed in US patent application publication numbers US 2011/0130993 A1 and US 2011/0199072 A1, the tracking filters 30 can be adapted to remove selected harmonics based on the frequency estimate signal $\omega_e$, for instance, with one of the filters 30 set to remove the second harmonic, in combination with one or more further tracking filters 30 set to other higher (e.g., $N^{TH}$) order harmonics. In operation, the tracking filters 30 provide filtered outputs as subtractive inputs to the summer 28 for offsetting the Vd' signal from the 3-2 converter 27 to provide the subtractive input to the initial summer 21. In this regard, previous attempts to combine such harmonic removal in the PLL loop with an in-loop tracking filter set to the fundamental (N=1) to control drift or offset suffered from filter bandwidth overlap or close filter band proximity. The implementation of FIG. 2, on the other hand, advantageously performs the offset removal/mitigation prior to introducing the sensor signals into the PLL loop, whereby such filter overlap is not an issue, and voltage sensor drift can be addressed without compromising the harmonic removal capabilities of the PLL/tracking filter architecture.

FIG. 3 provides a flow diagram 200 illustrating an exemplary process for reducing offset associated with one or more input signals in accordance with further aspects of the present disclosure. While the method 200 is illustrated and described below in the form of a series of acts or events, it will be appreciated that the various methods of the present disclosure are not limited by the illustrated ordering of such acts or events. In this regard, except as specifically provided hereinafter, some acts or events may occur in different order and/or concurrently with other acts or events apart from those illustrated and described herein. In addition, not all illustrated steps may be required to implement a process or method in accordance with the present disclosure, and one or more such acts may be combined. Furthermore, the illustrated methods may be implemented in hardware, processor-executed software, or combinations thereof, in order to provide the adaptive offset filtering functionality described herein, and may be employed in any signal processing including without limitation power converters and associated apparatus. For instance, the adaptive offset processing apparatus 100 illustrated and described above may implement the method 200 in certain embodiments.

At 202 in FIG. 3, one or more sensor input signals are received (e.g., Va, Vb, Vc received at an adaptive offset processor input 102), and a frequency signal (e.g., $\omega_e$) is received at 204. At 206, the sensor input signal(s) is filtered using an adaptive tracking filter (e.g., filter 110 in FIG. 1) having a center frequency set by the frequency signal ($\omega_e$) in order to generate a fundamental frequency signal (e.g., signal 112 above). At 208 in FIG. 3, the fundamental frequency signal is subtracted from the sensor input signal (summer 120 in FIG. 1) to generate a first modified signal with the fundamental frequency component removed (signal 122). At 210, the first modified signal is filtered (low pass filter 130 in FIG. 1) to generate a second modified signal (132) including the DC offset component with a fundamental and higher order harmonics removed. At 212, the second modified signal is subtracted from the sensor input signal (summer 140) to generate a third modified signal (Va' 142 in FIG. 1, Va', Vb' & Vc' in FIG. 2) with the DC offset component removed. This signal 142 is then provided to one or more tracking filters at 214 in certain embodiments (e.g. tracking filters 30 in FIG. 2) for harmonic reduction in the phase lock loop. This process 200 may then repeat steps 202-214 for further iterations in continuous fashion. In accordance with further aspects of the present disclosure, moreover, a non-transitory computer readable medium is provided, such as a computer memory, a memory within a power converter control system (e.g., switch control system 330 in FIG. 4 below), a CD-ROM, floppy disk, flash drive, database, server, computer, etc. which has computer executable instructions for performing the processes described above.

FIG. 4 illustrates an embodiment of a power conversion system 300 receiving multiphase AC input power from a power grid 302 and providing output AC power (e.g., variable frequency, variable amplitude) to a load 304. The load 304 may, but need not be, an AC motor. The power converter 300 includes an active front end rectifier 310 including a plurality of switching devices (not shown) for selectively connecting an associated one of the AC input phases with an upper or lower DC link connection, where the switching devices of the active front end 310 are operated according to switching control signals from a converter controller 330. The converter controller 330 may be implemented as any suitable hardware, processor-executed software, programmable logic, etc., or combinations thereof. Certain embodiments may be AC-DC power converters, in which case the resulting converted DC output of the active front end 310 is provided directly to drive a load. In other embodiments (as shown in FIG. 4), one or more subsequent power conversion stages may be provided. In the illustrated example, an inverter 320 receives DC input power from the intermediate DC link and converts this to variable frequency AC output power to drive the load 304, where the inverter is also operated according to switching control signals from the converter controller 330. The system 300 includes one or more sensors 2 for measuring or detecting the AC input phase voltages of the power grid 302, and the sensor output signals are provided as inputs 102 to an adaptive offset processor 100 similar to that described above in connection with FIGS. 1-3. The adaptive offset processor 100 is part of a phase angle detector 10 (FIG. 2 above) which receives a d-axis voltage command input Vd* from the converter controller 330, and the angle detector 10 provides a phase angle output θ to the controller 330 for synchronizing the operation of the active front end 320 to the phase of the power grid 302. In certain embodiments, the phase angle detector 10 may be integrated within the converter controller 330, or the angle detector 10 may be separately implemented.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A method for reducing at least one offset component in an input signal, the method comprising:
    using an adaptive tracking filter having an adaptive passband defined by a frequency signal, removing substantially all frequency components of the input signal that are outside the passband to generate a fundamental frequency signal;
    subtracting the fundamental frequency signal from the input signal to generate a first modified signal with a fundamental frequency component substantially removed;
    using a low pass filter having a cutoff frequency, removing substantially all high frequency components above the cutoff frequency from the first modified signal to generate a second modified signal including a DC offset component with the fundamental frequency component and higher order harmonics substantially removed; and
    subtracting the second modified signal from the input signal to generate a third modified signal substantially including the fundamental frequency component and higher order harmonics of the input signal with the DC offset component substantially removed.

2. The method of claim 1, wherein the cutoff frequency of the low pass filter is below the fundamental frequency component.

3. The method of claim 1, wherein at least one of the input signal and the frequency signal is an analog signal.

4. The method of claim 1, wherein at least one of the input signal and the frequency signal is a digital signal including a plurality of values.

5. The method of claim 1, wherein the cutoff frequency of the low pass filter is above the fundamental frequency component.

6. The method of claim 1, comprising estimating and reducing a disturbance frequency component in the third modified signal.

7. The method of claim 6, comprising estimating and reducing the disturbance frequency component in the third modified signal using at least one tracking filter.

8. The method of claim 6, wherein the cutoff frequency of the low pass filter is below the fundamental frequency component.

9. The method of claim 6, wherein at least one of the input signal and the frequency signal is an analog signal.

10. The method of claim 6, wherein at least one of the input signal and the frequency signal is a digital signal including a plurality of values.

11. The method of claim 6, wherein the cutoff frequency of the low pass filter is above the fundamental frequency component.

12. A non-transitory computer readable medium comprising computer executable instructions for reducing at least one offset component in an input signal, the non-transitory computer readable medium comprising computer executable instructions for:
    removing substantially all frequency components of the input signal that are outside an adaptive passband defined by a frequency signal to generate a fundamental frequency signal;
    subtracting the fundamental frequency signal from the input signal to generate a first modified signal with a fundamental frequency component substantially removed;
    removing substantially all high frequency components above a cutoff frequency from the first modified signal to generate a second modified signal including a DC offset component with the fundamental frequency component and higher order harmonics substantially removed; and
    subtracting the second modified signal from the input signal to generate a third modified signal substantially including the fundamental frequency component and higher order harmonics of the input signal with the DC offset component substantially removed.

13. The non-transitory computer readable medium of claim 12, wherein the cutoff frequency of the low pass filter is below the fundamental frequency component.

14. The non-transitory computer readable medium of claim 12, wherein at least one of the input signal and the frequency signal is an analog signal.

15. The non-transitory computer readable medium of claim 12, wherein at least one of the input signal and the frequency signal is a digital signal including a plurality of values.

16. The non-transitory computer readable medium of claim 12, wherein the cutoff frequency is above the fundamental frequency component.

17. The non-transitory computer readable medium of claim 12, further comprising computer executable instructions for estimating and reducing a disturbance frequency component in the third modified signal.

18. The non-transitory computer readable medium of claim 17, further comprising computer executable instructions for estimating and reducing the disturbance frequency component in the third modified signal using at least one tracking filter.

19. The non-transitory computer readable medium of claim 17, wherein the cutoff frequency is below the fundamental frequency component.

20. The non-transitory computer readable medium of claim 17, wherein at least one of the input signal and the frequency signal is an analog signal.

* * * * *